(12) United States Patent
Chu et al.

(10) Patent No.: US 9,029,950 B2
(45) Date of Patent: May 12, 2015

(54) SEMICONDUCTOR STRUCTURE AND METHOD FOR FORMING THE SAME

(75) Inventors: Chien-Wen Chu, Yangmei Township, Taoyuan County (TW); Wing-Chor Chan, Hsinchu (TW); Shyi-Yuan Wu, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/425,221

(22) Filed: Mar. 20, 2012

(65) Prior Publication Data
US 2013/0249007 A1 Sep. 26, 2013

(51) Int. Cl.
*H01L 21/84* (2006.01)
*H01L 27/12* (2006.01)
*H01L 29/78* (2006.01)

(52) U.S. Cl.
CPC .................................. *H01L 29/7816* (2013.01)

(58) Field of Classification Search
CPC ..... H01L 21/84; H01L 21/8222; H01L 27/12; H01L 31/113; H01L 29/78; H01L 21/336
USPC .......... 257/350, 347, 343, E29.261, E29.256, 257/E21.417, 339; 438/152, 155, 309, 286
IPC ............... H01L 21/84, 21/8222, 21/336, 29/78, H01L 29/94, 29/76, 27/12, 31/113
See application file for complete search history.

(56) References Cited

U.S. PATENT DOCUMENTS

| 8,058,129 B2 | 11/2011 | Lee | |
| 2003/0001209 A1* | 1/2003 | John et al. | 257/350 |
| 2005/0062125 A1* | 3/2005 | Kitaguchi | 257/492 |
| 2005/0194647 A1* | 9/2005 | Tsai et al. | 257/377 |
| 2012/0126323 A1* | 5/2012 | Wu et al. | 257/343 |
| 2012/0228705 A1* | 9/2012 | Toh et al. | 257/339 |

FOREIGN PATENT DOCUMENTS

| TW | 182074 | 4/1992 |
| TW | 201021212 A1 | 6/2010 |
| TW | 201135928 A1 | 10/2011 |

OTHER PUBLICATIONS

TW Office Action dated Mar. 28, 2014.
English Abstract translation of TW182074 (Published Apr. 11, 1992).

* cited by examiner

*Primary Examiner* — David Vu
*Assistant Examiner* — Mouloucoulaye Inoussa
(74) *Attorney, Agent, or Firm* — McClure, Qualey & Rodack, LLP

(57) ABSTRACT

A semiconductor structure and a method for forming the same are provided. The semiconductor structure comprises a substrate, a first source/drain region, a second source/drain region, a first stack structure and a second stack structure. The first source/drain region is formed in the substrate. The second source/drain region is formed in the substrate. The first stack structure is on the substrate between the first source/drain region and the second source/drain region. The first stack structure comprises a first dielectric layer and a first conductive layer on the first dielectric layer. The second stack structure is on the first stack structure. The second stack structure comprises a second dielectric layer and a second conductive layer on the second dielectric layer.

16 Claims, 5 Drawing Sheets

SEMICONDUCTOR STRUCTURE AND METHOD FOR FORMING THE SAME

BACKGROUND

1. Technical Field

The disclosure relates in general to a semiconductor structure and a method for forming the same and more particularly to a MOS and a method for forming the same.

2. Description of the Related Art

In the semiconductor technology, the feature size of the semiconductor structure has been reduced. In the meantime, the rate, the efficiency, the density and the cost per integrated circuit unit have been improved.

For example, a method for increasing a breakdown voltage (BVdss) of a semiconductor structure such as a LDMOS or an EDMOS is decreasing a dopant concentration of a drain region and increasing a drift length. However, a specific on-state resistance (Ron,sp) of the semiconductor structure is increased due to the method. Therefore, the semiconductor structure could not obtain a trade off between the BVdss and the Ron,sp for obtaining a desired small figure of merit (FOM=Ron,sp/BVdss).

SUMMARY

A semiconductor structure is provided. The semiconductor structure comprises a substrate, a first source/drain region, a second source/drain region, a first stack structure and a second stack structure. The first source/drain region is formed in the substrate. The second source/drain region is formed in the substrate. The first stack structure is on the substrate between the first source/drain region and the second source/drain region. The first stack structure comprises a first dielectric layer and a first conductive layer on the first dielectric layer. The second stack structure is on the first stack structure. The second stack structure comprises a second dielectric layer and a second conductive layer on the second dielectric layer.

A method for forming a semiconductor structure is provided. The method comprises following steps. A first source/drain region is formed in a substrate. A second source/drain region is formed in the substrate. A first stack structure is formed by forming a first dielectric layer on a substrate between the first source/drain region and the second source/drain region and forming a first conductive layer on the first dielectric layer. A second stack structure is formed by forming a second dielectric layer on the first conductive layer of the first stack structure and forming second conductive layer on the second dielectric layer.

The above and other aspects of the disclosure will become better understood with regard to the following detailed description of the non-limiting embodiment(s). The following description is made with reference to the accompanying drawings.

DETAILED DESCRIPTION

First Embodiment

Figure 1:
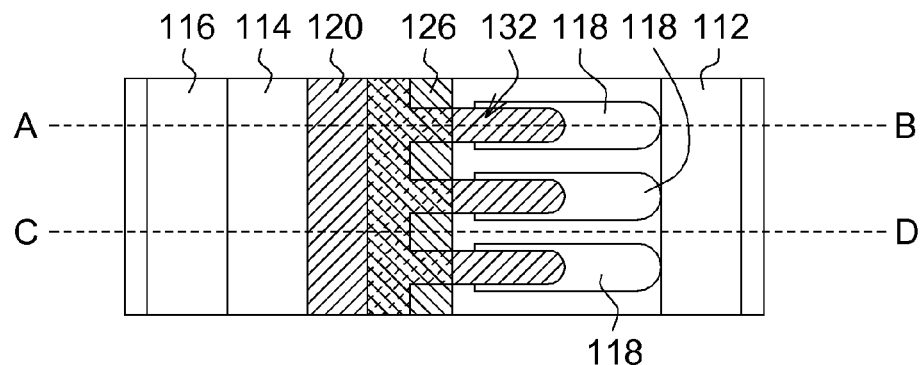
FIG. 1 illustrates a top view of a semiconductor structure according to one embodiment.
Figure 2:
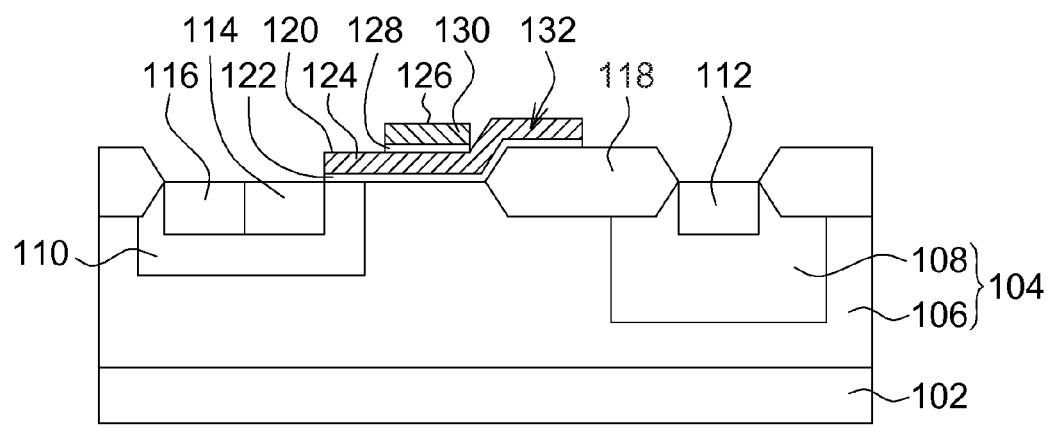
FIG. 2 illustrates a cross-section view of a semiconductor structure according to one embodiment.
Figure 3:
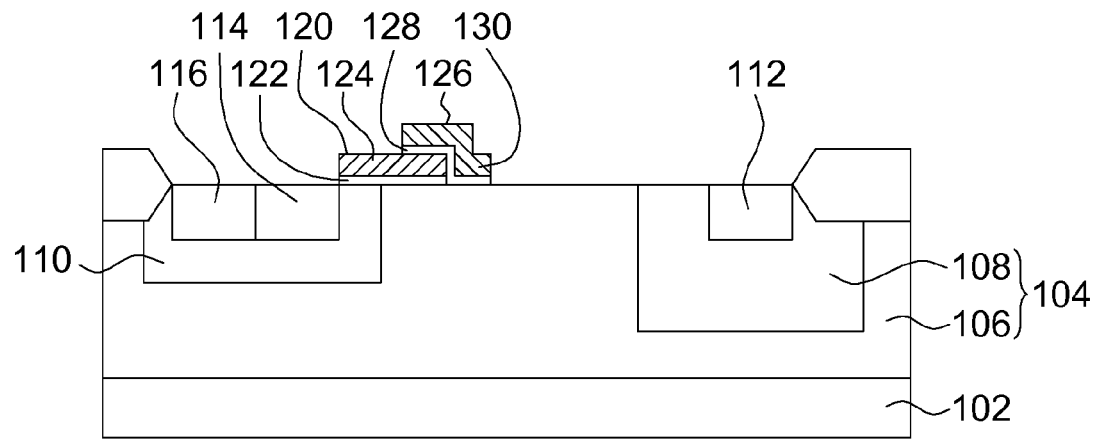
FIG. 3 illustrates a cross-section view of a semiconductor structure according to one embodiment.

FIG. 1 illustrates a top view of a semiconductor structure. FIG. 2 illustrates a cross-section view of the semiconductor structure along AB line in FIG. 1. FIG. 3 illustrates a cross-section view of the semiconductor structure along CD line in FIG. 1.

Referring to FIG. 2 and FIG. 3, the semiconductor structure comprises a substrate 102. For example, the substrate 102 may comprise a bulk silicon, a silicon on insulator (SOI), etc. The substrate 102 may be formed by an epitaxial process or a non-epitaxial process. A first doped region 104 comprises a doped well 106 and a doped well 108. The doped well 106 is formed in the substrate 102 by an implanting step. The doped well 108 is formed in the doped well 106 by an implanting step. A second doped region 110 is formed in the doped well 106 of the first doped region 104 by an implanting step. A first source/drain region 112 is formed in the doped well 108 of the first doped region 104 by an implanting step. A second source/drain region 114 is formed in the second doped region 110 by an implanting step. A heavily doped region 116 is formed in the second doped region 110 by an implanting step.

Referring to FIG. 1 and FIG. 2, insulating structures 118 separated from each other are formed on the doped well 106 and the doped well 108 of the first doped region 104 between the first source/drain region 112 and the second source/drain region 114. The insulating structure 118 is not limited to FOX formed by a local oxidation of silicon (LOCOS) process as shown in FIG. 2. In embodiments, the insulating structure 118 may comprise a STI, a DTI or other suitable structures.

Referring to FIG. 2 and FIG. 3, a first stack structure 120 is formed on the first doped region 104 and the second doped region 110 between the first source/drain region 112 and the second source/drain region 114. The first stack structure 120 comprises a first dielectric layer 122 and a first conductive layer 124. The first dielectric layer 122 is formed on the first doped region 104 and the second doped region 110 between the first source/drain region 112 and the second source/drain region 114. The first conductive layer 124 is formed on the first dielectric layer 122. In embodiments, for example, the first stack structure 120 is formed by forming a dielectric material (not shown) on the substrate 102, forming a conductive material (not shown) on the dielectric material, and then patterning the dielectric material and the conductive material. The dielectric material and the conductive material may be patterned simultaneously by a patterned mask layer, so as to form the first dielectric layer 122 having a sidewall aligned with a sidewall of the first conductive layer 124. The first dielectric layer 122 may comprises an oxide or a nitride, such as silicon oxide, silicon nitride or silicon oxynitride. For example, the first dielectric layer 122 is an oxide, or has an oxide-nitride-oxide (ONO) structure. The first conductive layer 124 may comprise polysilicon, a metal silicide, a metal or other suitable materials.

Referring to FIG. 2 and FIG. 3, a second stack structure 126 is formed on the first stack structure 120. The second stack structure 126 comprises a second dielectric layer 128 and a second conductive layer 130 formed on the second dielectric layer 128. In embodiments, for example, second stack structure 126 is formed by forming a dielectric material (not shown), forming a conductive material (not shown) on the dielectric material, and then patterning the dielectric material and the conductive material. The dielectric material and the conductive material may be patterned simultaneously by a patterned mask layer, so as to form the second dielectric layer 128 having a sidewall aligned with a sidewall of the second conductive layer 130. The second dielectric layer 128 may comprises an oxide or a nitride, such as silicon oxide, silicon nitride or silicon oxynitride. For example, the second dielectric layer 128 is an oxide, or has an oxide-nitride-oxide (ONO) structure. The second conductive layer 130 may comprise polysilicon, a metal silicide, a metal or other suitable materials.

Referring to FIG. 1 and FIG. 2, the first stack structure 120 has protrusion portions 132 separated from each other. The protrusion portions 132 of the first stack structure 120 are extended beyond the second stack structure 126. In addition, the protrusion portions 132 are corresponsively extended on the insulating structures 118.

Referring to FIG. 3, the second stack structure 126 is on a top surface and a sidewall of the first stack structure 120. In addition, the second stack structure 126 may be extended on the doped well 106 of the first doped region 104.

Referring to FIG. 2 and FIG. 3, in some embodiments, the doped well 106 and the doped well 108 of the first doped region 104, and the first source/drain region 112 and the second source/drain region 114 have a first type conductivity such as N-type conductivity. The substrate 102, the second doped region 110 and the heavily doped region 116 have a second type conductivity such as P-type conductivity, opposite to the first type conductivity. In other embodiments, the first type conductivity is P-type conductivity, and the second type conductivity is N-type conductivity.

In embodiments, for example, the semiconductor structure is a MOS, such as LDMOS or EDMOS. The first source/drain region 112 is used as a drain. The second source/drain region 114 is used as a source. The first stack structure 120 is mainly used as a gate structure for controlling a channel of the semiconductor structure. In this case, the first dielectric layer 122 of the first stack structure 120 is used as a gate dielectric layer, and the first conductive layer 124 of the first stack structure 120 is used as a gate electrode layer. The second stack structure 126 formed by the second dielectric layer 128 and the second conductive layer 130 plays an important role to resist a high voltage and reduce an accumulation layer resistance.

In embodiments, the semiconductor structure has the insulating structures 118 separated from each other in a drift region. In addition, the protrusion portions 132 of the first stack structure 120 are extended on the insulating structures 118. Therefore, an electrical field peak can be induced along an edge of the first conductive layer 124 of the first stack structure 120. In addition, the semiconductor structure can obtain a good trade-off between a specific on-state resistance (Ron,sp) and a breakdown voltage (BVdss) to obtain a desired figure of merit (FOM).

In embodiments, a thickness of the first dielectric layer 122 of the first stack structure 120 is smaller than a thickness of the second dielectric layer 128 of the second stack structure 126. Therefore, the semiconductor structure can have a high drain breakdown voltage. In addition, the thickness of the second dielectric layer 128 is smaller than a thickness of the insulating structures 118. Therefore, the accumulation layer resistance of the semiconductor structure can be reduced. In detail, the first dielectric layer 122 and the second dielectric layer 128 may have uniform thickness, respectively. In a case of the insulating structures 118 having an un-uniform thickness, the thickness of the second dielectric layer 128 is smaller than the maximum thickness of the insulating structures 118. For example, the thickness of the second dielectric layer 128 is smaller than the maximum thickness of the insulating structures 118 being a FOX.

In embodiments, the semiconductor structure may be formed by a CMOS process having a poly-insulator-poly capacitor (PIP capacitor) process that is compatible with processes for other devices. Therefore, the manufacturing cost is decreased.

Second Embodiment

Figure 4:
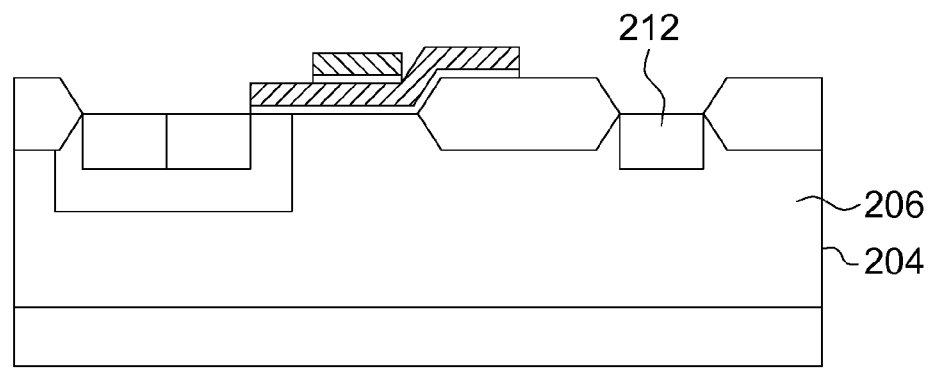
FIG. 4 illustrates a cross-section view of a semiconductor structure according to one embodiment.
Figure 5:
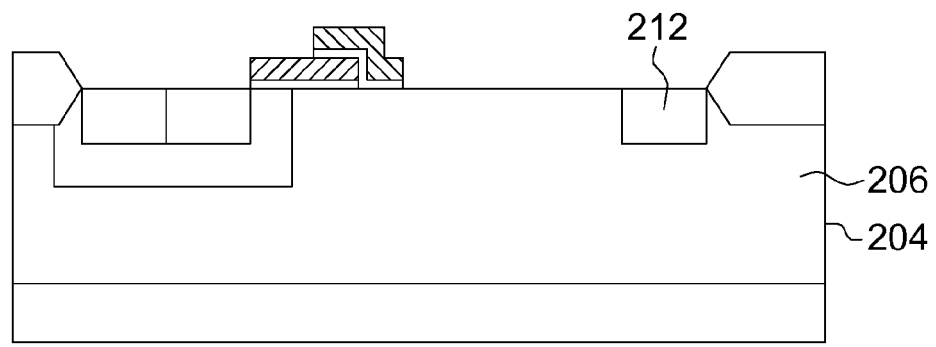
FIG. 5 illustrates a cross-section view of a semiconductor structure according to one embodiment.

FIG. 4 and FIG. 5 illustrate a cross-section view of the semiconductor structure. A top view of the semiconductor structure of the second embodiment may be similar to FIG. 1. For example, FIG. 4 is drawn along AB line in FIG. 1. FIG. 5 is drawn along CD line in FIG. 1. The semiconductor structure shown in FIG. 4 and FIG. 5 is different from the semiconductor structure shown in FIG. 2 and FIG. 3 in that the doped well 108 of the first doped region 104 shown in FIG. 2 and FIG. 3 is omitted. In other words, the first source/drain region 212 is formed in the doped well 206 of the first doped region 204.

Third Embodiment

Figure 6:
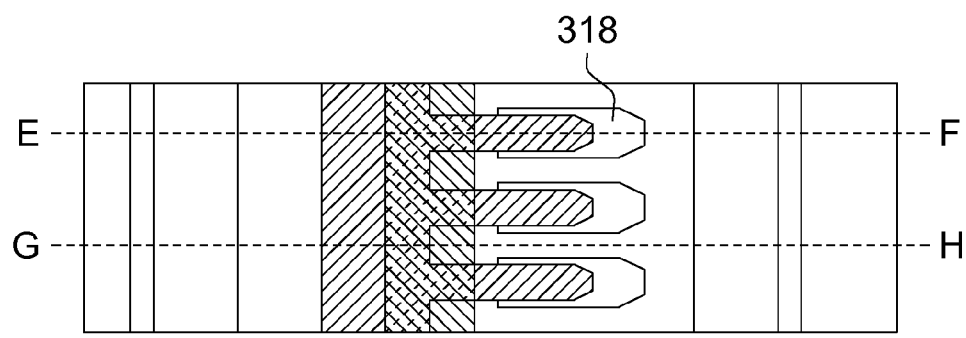
FIG. 6 illustrates a top view of a semiconductor structure according to one embodiment.
Figure 7:
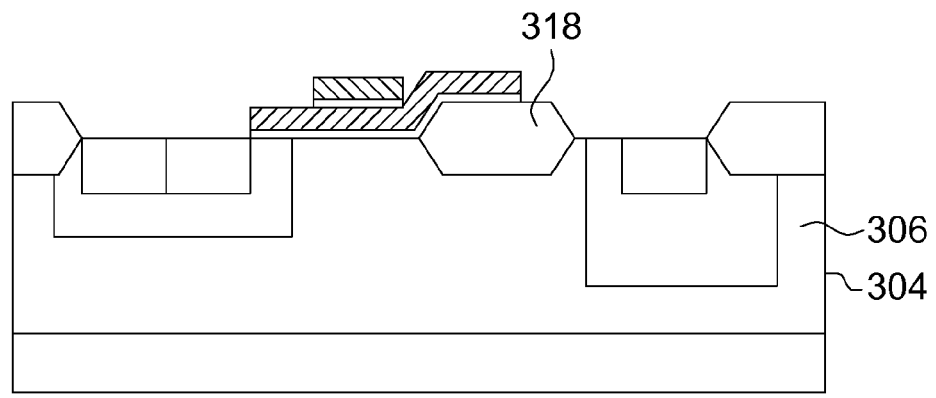
FIG. 7 illustrates a cross-section view of a semiconductor structure according to one embodiment.

FIG. 6 illustrates a top view of the semiconductor structure. FIG. 7 illustrates a cross-section view of the semiconductor structure along EF line in FIG. 6. The semiconductor structure of the third embodiment shown in FIG. 6 and FIG. 7 is different from the semiconductor structure of the first embodiment shown in FIG. 1 and FIG. 2 in that the insulating structures 318 are formed on the doped well 306 of the first doped region 304. In one embodiment, a cross-section view of the semiconductor structure along GH line in FIG. 6 is similar to FIG. 3.

Fourth Embodiment

Figure 8:
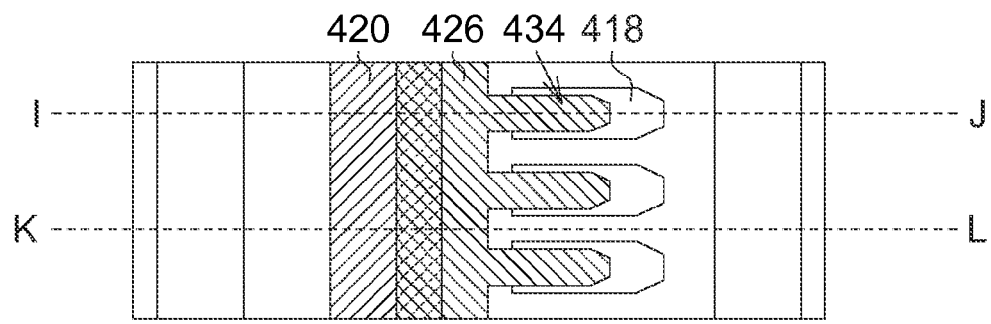
FIG. 8 illustrates a top view of a semiconductor structure according to one embodiment.
Figure 9:
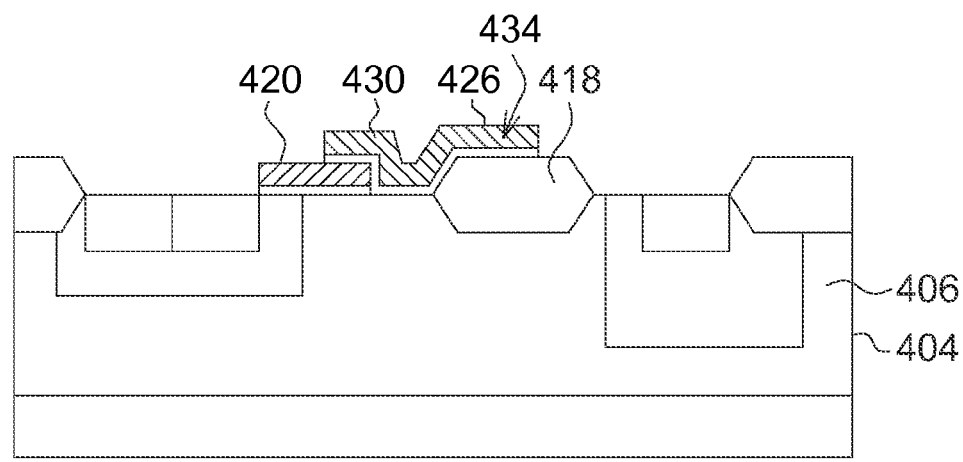
FIG. 9 illustrates a cross-section view of a semiconductor structure according to one embodiment.
Figure 10:
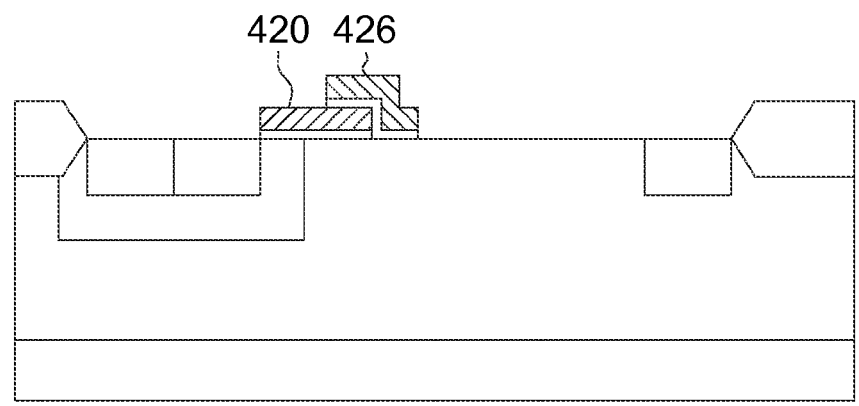
FIG. 10 illustrates a cross-section view of a semiconductor structure according to one embodiment.

FIG. 8 illustrates a top view of the semiconductor structure. FIG. 9 illustrates a cross-section view of the semiconductor structure along IJ line in FIG. 8. FIG. 10 illustrates a cross-section view of the semiconductor structure along KL line in FIG. 8. The semiconductor structure shown in FIG. 8 to FIG. 10 is different from the semiconductor structure shown in FIG. 1 to FIG. 3 in that the second stack structure 426 has protrusion portions 434 separated from each other and extended beyond the first stack structure 420. Referring to FIG. 8 and FIG. 9, the protrusion portions 434 of the second stack structure 426 are extended on the doped well 406 of the first doped region 404 between the insulating structures 418 and the first stack structure 420. In addition, the protrusion portions 434 are corresponsively extended on the insulating structures 418. Therefore, an electrical field peak can be induced along an edge of the second conductive layer 430 of the second stack structure 426. In addition, the semiconductor structure can obtain a good trade-off between a Ron,sp and a BVdss to obtain a desired FOM. Referring to FIG. 10, the second stack structure 426 is on a top surface and a sidewall of the first stack structure 420.

Fifth Embodiment

Figure 11:
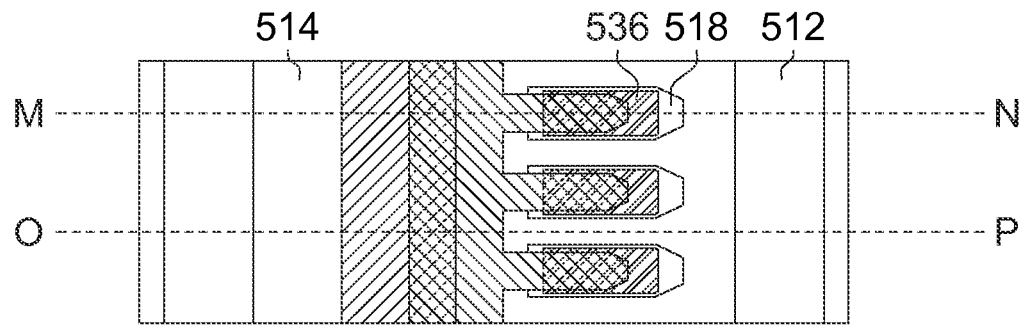
FIG. 11 illustrates a top view of a semiconductor structure according to one embodiment.
Figure 12:
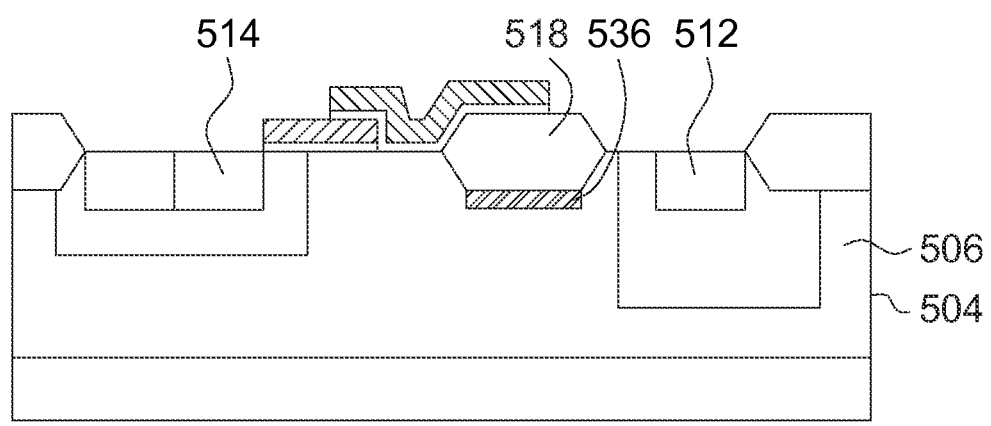
FIG. 12 illustrates a cross-section view of a semiconductor structure according to one embodiment.

FIG. 11 illustrates a top view of the semiconductor structure. FIG. 12 illustrates a cross-section view of the semiconductor structure along MN line in FIG. 11. The semiconductor structure of the fifth embodiment shown in FIG. 11 and FIG. 12 is different from the semiconductor structure of the fourth embodiment shown in FIG. 8 and FIG. 9 in that top doped regions 536 are corresponsively formed in the doped well 506 of the first doped region 504 under the insulating structures 518 between the first source/drain region 512 and the second source/drain region 514. In embodiments, the top doped region 536 has the second type conductivity such as P-type conductivity. The top doped regions 536 can be used for reducing a Ron,sp and increasing a BVdss of the semiconductor structure. In one embodiment, a cross-section view of the semiconductor structure along OP line in FIG. 11 is similar to FIG. 10.

According to embodiments, the semiconductor structure has insulating structures separated from each other. In addition, the protrusion portions of the first stack structure or the second stack structure are corresponsively extended on the insulating structures. Therefore, the semiconductor structure can obtain a good trade-off between a Ron,sp and a BVdss to obtain a desired FOM. Moreover, the thickness of the first dielectric layer of the first stack structure is smaller than the thickness of the (second dielectric layer of the second stack structure. Therefore, a drain breakdown voltage of the semiconductor structure can be increased. In addition, the thickness of the second dielectric layer is smaller than the thickness of the insulating structure. Therefore, the accumulation layer resistance of the semiconductor structure can be reduced. Using the top doped regions can reduce a Ron,sp and increase a BVdss of the semiconductor structure. The manufacturing process for the semiconductor structure in embodiments be compatible with processes for other devices. Therefore, the manufacturing cost is decreased.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a substrate;
    a first source/drain region formed in the substrate;
    a second source/drain region formed in the substrate;
    insulating structures wholly separated from each other on the substrate;
    a first stack structure on the substrate between the first source/drain region and the second source/drain region, wherein the first stack structure comprises a first dielectric layer and a first conductive layer on the first dielectric layer, the first stack structure comprises protrusion portions, each of the protrusion portions protruding on the same side of the first stack structure is extended on a corresponding one of the insulating structures; and
    a second stack structure on the first stack structure, wherein the second stack structure comprises a second dielectric layer and a second conductive layer on the second dielectric layer.

2. The semiconductor structure according to claim 1, wherein a thickness of the first dielectric layer is smaller than a thickness of the second dielectric layer.

3. The semiconductor structure according to claim 1, wherein the insulating structure are on the substrate between the first source/drain region and the second source/drain region.

4. The semiconductor structure according to claim 3, wherein a thickness of the second dielectric layer is smaller than a thickness of the insulating structure.

5. The semiconductor structure according to claim 1, wherein the protrusion portions of the first stack structure are extended beyond the second stack structure.

6. The semiconductor structure according to claim 1, further comprising:
    a first doped region formed in the substrate and having a first type conductivity; and
    a second doped region formed in the first doped region and having a second type conductivity opposite to the first type conductivity,
    wherein the first source/drain region is formed in the first doped region and having the first type conductivity, and the second source/drain region is formed in the second doped region and having the first type conductivity.

7. The semiconductor structure according to claim 6, wherein the first stack structure is on the second doped region between the first source/drain region and the second source/drain region.

8. The semiconductor structure according to claim 6, further comprising top doped region separated from each other and formed in the first doped region between the first source/drain region and the second source/drain region.

9. The semiconductor structure according to claim 8, wherein the top doped region has the second type conductivity.

10. The semiconductor structure according to claim 6, wherein the insulating structures are on the first doped region between the first source/drain region and the second source/drain region.

11. The semiconductor structure according to claim 10, further comprising top doped regions separated from each other and correspondingly formed in the first doped region under the insulating structures.

12. The semiconductor structure according to claim 1, wherein the second stack structure is on a top surface and a sidewall of the first stack structure.

13. The semiconductor structure according to claim 1, wherein the second stack structure is on a top surface and a sidewall of the first stack structure.

14. The semiconductor structure according to claim 1, wherein a sidewall of the first dielectric layer is aligned with a sidewall of the first conductive layer, and a sidewall of the second dielectric layer is aligned with a sidewall of the second conductive layer.

15. A method for forming a semiconductor structure, comprising:
    forming a first source/drain region in a substrate;
    forming a second source/drain region in the substrate;
    forming insulating structures wholly separated from each other on the substrate;
    forming a first stack structure by forming a first dielectric layer on a substrate between the first source/drain region and the second source/drain region and forming a first conductive layer on the first dielectric layer, wherein the first stack structure comprises protrusion portions, each of the protrusion portions protruding on the same side of the first stack structure is extended on a corresponding one of the insulating structures; and forming a second stack structure by forming a second dielectric layer on the first conductive layer of the first stack structure and forming a second conductive layer on the second dielectric layer.

16. The method for forming a semiconductor structure forming the semiconductor structure according to claim 15, wherein the insulating structures are on the substrate between the first source/drain region and the second source/drain region.

\* \* \* \* \*